United States Patent [19]

Sugiura et al.

[11] Patent Number: 4,589,794
[45] Date of Patent: May 20, 1986

[54] SECURING UNIT

[75] Inventors: Haruyuki Sugiura, Kariya; Yoshitoki Hayashi, Aichi; Kazuhiro Matsui, Toyoake, all of Japan

[73] Assignee: Kitagawa Industries Co., Ltd., Nagoya, Japan

[21] Appl. No.: 601,578

[22] Filed: Apr. 18, 1984

[30] Foreign Application Priority Data

Jun. 28, 1983 [JP] Japan .............................. 58-99855[U]

[51] Int. Cl.$^4$ .............................................. F16B 7/04
[52] U.S. Cl. ................... 403/187; 403/201; 403/286; 403/405.1; 403/409.1; 24/336; 24/326; 339/125 R; 339/65
[58] Field of Search ................ 339/125, 65, 66, 17 L, 339/17 LM; 403/187, 201, 286, 405, 406, 409; 24/336, 326, 453, 297, 562, 545

[56] References Cited

U.S. PATENT DOCUMENTS

| 3,122,604 | 2/1964 | Cook et al. ....................... 24/326 X |
| 3,646,500 | 2/1972 | Wessely ............................... 339/65 |
| 3,811,154 | 5/1974 | Lindemann et al. ................ 24/326 |
| 3,975,076 | 8/1976 | Shida et al. ...................... 339/125 R |
| 4,129,351 | 12/1978 | Sugimoto et al. ............. 339/17 LM |
| 4,373,826 | 2/1983 | Inamoto et al. .................. 24/297 X |

FOREIGN PATENT DOCUMENTS

| 2736545 | 2/1979 | Fed. Rep. of Germany . |
| 2808899 | 9/1979 | Fed. Rep. of Germany . |
| 3121967 | 6/1983 | Fed. Rep. of Germany . |
| 583384 | 12/1946 | United Kingdom . |
| 1238879 | 7/1971 | United Kingdom . |
| 1280076 | 7/1972 | United Kingdom . |
| 1316217 | 5/1973 | United Kingdom . |
| 1227418 | 4/1977 | United Kingdom . |
| 2014643 | 3/1982 | United Kingdom . |
| 2081363 | 3/1984 | United Kingdom . |

OTHER PUBLICATIONS

British Search Report 8410232.

Primary Examiner—Cornelius J. Husar
Assistant Examiner—Joseph A. Fischetti
Attorney, Agent, or Firm—Oblon, Fisher, Spivak, McClelland & Maier

[57] ABSTRACT

A securing unit for mounting a board such as a wiring board or a printed circuit board between securing members formed thereon on the front side. At least one detent member is formed on the rear side of the securing unit so as to be insertable into a mounting hole formed on a fixing plate such as a chassis so as to secure or fix the securing unit. The securing unit comprises a bottom plate, at least one opposed wall formed on the front surface of the bottom plate, at least one holding member formed on the front surface of the bottom plate and located opposite to the opposed wall, and at least one detent member formed on the rear side of the bottom plate so as to resiliently fix the securing unit on the chassis. At least one detent projection is formed on any one of the opposed wall, the holding member, or both the opposed wall and the holding member, respectively, so as to prevent or stop the movement or shift of the board to be inserted. With this construction, the board is removably mounted and held firmly on the securing unit, while the securing unit according to the present invention is fixed or secured on the fixing plate or chassis.

8 Claims, 17 Drawing Figures

SECURING UNIT

BACKGROUND OF THE INVENTION

1. Field of the Invention

The present invention relates to a securing unit capable of mounting a board or a base plate for electronic apparatuses or appliances, especially to a securing unit capable of gripping the end of the board and also capable of removably mounting it on a fixing plate member.

2. Description of the Prior Art

There are many electronic apparatuses and appliances with a chassis or chassis and a mounting board or boards, such as a printed circuit board or a wiring board, with such a board mounted vertically. In order to mount these boards, however, it is conventionally normal to insert an engagement portion provided at the extreme end of a fixing member into a mounting hole formed on the board by inserting it in the horizontal direction. Accordingly, it is necessary to disengage or remove the engagement portion of the fixing member out of the hole of the board by moving the board in the horizontal direction and then draw it in the vertical direction. For this reason, there were some problems such as that it was troublesome to draw the board out of the fixing member in order to check and repair the boards and the efficiency was not good.

Moreover, another problem that occurs is that when the fixing member is arranged in such a manner that the board can be easily removed, backlash thereof often occurs, while an accurate positioning of the board cannot be realized.

SUMMARY OF THE INVENTION

It is therefore an object of the present invention to provide a securing unit which is capable of removably holding vertically a board to be mounted and also capable of suitably positioning the board without backlash.

It is another object of the present invention to provide a securing unit in which a pair of opposed walls holding members and a pushing member are provided on a horizontal bottom plate. The holding members and the pushing member extend in the vertical direction angularly to the bottom plate resiliently push and grip the board to be inserted between them. At least one detent projection for preventing the movement of the base plate is formed on any one of the opposed walls, the holding members, or the bottom plate of the securing unit.

It is a further object of the present invention to provide a securing unit in which at least one resilient detent member is formed on the bottom surface of the bottom plate, which engages with another fixing plate member such as the chasis as well as securing the board by the opposed walls and the holding members.

It is still another object of the present invention to provide a securing unit which can removably hold and grip the base plate between the opposed walls and the holding members with a resiliency.

One of the features according to the present invention resides in the securing unit for mounting a board or base board such as a wiring plate by gripping the end portion of the base plate which comprises:

a bottom plate having at the rear side thereof at least one detent member capable of mounting on a fixing plate such as a chassis;

a pair of opposed walls formed on the surface of the said bottom plate and extending substantially in the vertical direction so as to resiliently push one surface of said base plate to be inserted and gripped;

a pair of holding members and a pushing member formed on the surface of said bottom plate opposite to said pushing member so as to resiliently push the other surface of the base plate to be inserted and gripped, said pair of holding members and said pushing member extending toward upward, with said pushing member located between said pair of holding members;

said pair of opposed walls and the pair of said holding members and said pushing member gripping said base plate to be inserted between them; and at least one detent projection provided on any one of said opposed walls, said holding members, or both said opposed walls and said holding members or said bottom plate so as to restrict the movement of said base plate thus gripped in any directions on the surface of said base plate, all the components being integrally formed in one piece.

These and other objects, features and advantages of the present invention will be better understood from the following detailed description with reference to the attached drawings.

DETAILED DESCRIPTION OF THE PREFERRED EMBODIMENT

Figure 1:
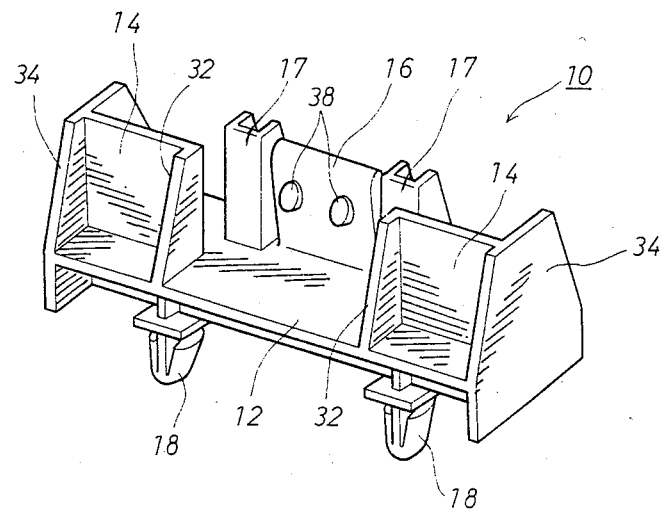
FIG. 1 is an overall perspective view of the securing unit according to one embodiment of the present invention.
Figure 2:
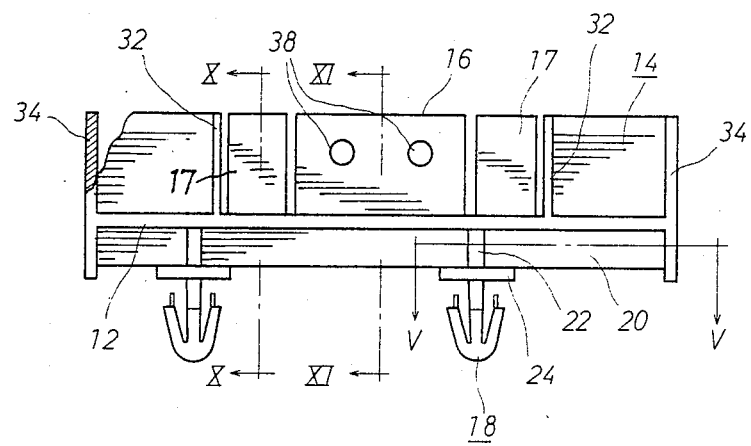
FIG. 2 is an elevational view of the securing unit according to the present invention of FIG. 1.
Figure 3:
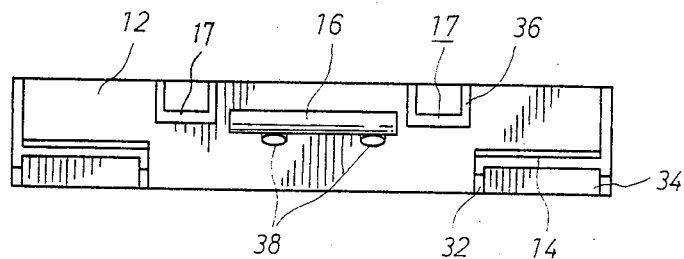
FIG. 3 is a top view of the securing unit according to the present invention of FIG. 1.
Figure 4:
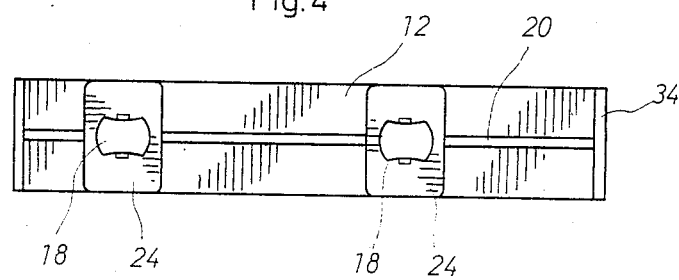
FIG. 4 is a bottom view of the securing unit according to the present invention of FIG. 1.

Referring to FIG. 1 where the securing unit 10 according to the present invention is shown, which comprises a bottom plate 12, a pair of opposed walls 14, 14, a pair of holding members 17, 17, a pushing member 16, and detent members 18, 18. All of these components are integrally formed in one piece made of a material such as nylon in this embodiment.

As shown in FIGS. 2 to 6, the bottom plate 12 is provided with various members, such as the opposed walls 14,14, the first and second holding members 17,17, and the pushing member 16, mentioned above. Ribs 32,34 are formed on the opposed walls 14. On the rear surface of the bottom plate 12, there are provided the previously mentioned pair of detent members 18,18, which are inserted into corresponding mounting holes formed on a fixing plate member, such as a chassis, not shown. Each detent members 18,18, is provided vertically on each seat plate 24 which is integrally formed on a rib 22. Each rib 22 is orthogonal to a rib 20 provided on the bottom plate 12 in the longitudinal direction.

Figure 8:
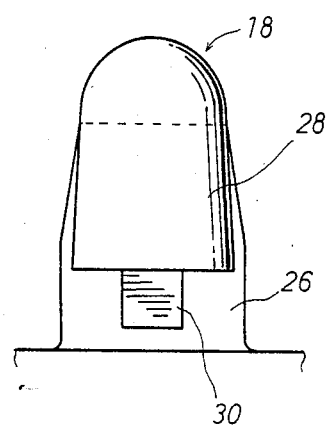
FIG. 8 is an enlarged side view of the detent member of the securing unit according to the present invention.
Figure 7:
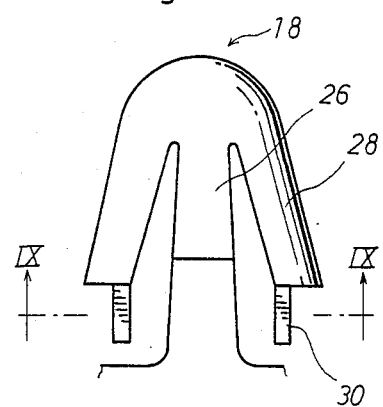
FIG. 7 is an enlarged elevational view of the detent member of the securing unit according to the present invention.
Figure 9:
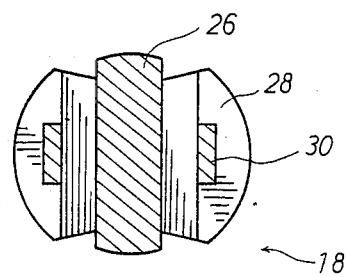
FIG. 9 is an enlarged cross sectional view of the detent member of the securing unit according to the present invention, cut along the line IX—IX and viewed upward from the line in FIG. 7.

FIGS. 7 to 9 show respectively enlarged plane, side and bottom views of one of the detent members 18. As clearly shown in the drawings, each detent member 18 is provided with a pair of resilient detent leg members 28, 28 at the top of a link member 26 and engagement projections 30,30 are provided at each open end portion of each resilient detent leg member 28, 28. All these components are also integrally formed in one piece, and the resilient detent leg members 28,28 are resiliently deformable in the right and left directions when they are inserted into the mounting holes on the chassis. Namely, at least one resilient detent leg member 28 can be mounted on the chasis by inserting it into a corresponding mounting hole formed on the chassis, for instance, and by making the ends of the resilient detent leg members 28,28 engage with the periphery of the associated hole, with each engagement projection 30 of the resilient detent leg member 28 extended and engaged in each hole after restoring its resiliency, respectively.

Figure 6:
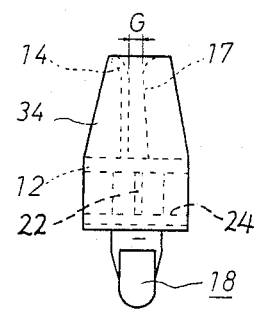
FIG. 6 is a side view of the securing unit according to the present invention of FIG. 1.
Figure 5:
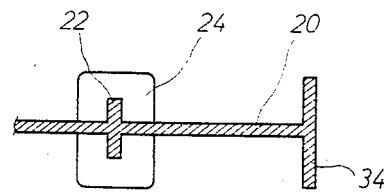
FIG. 5 is a partial cross sectional view of the securing unit according to the present invention cut along the line V—V in FIG. 2.
Figure 10:
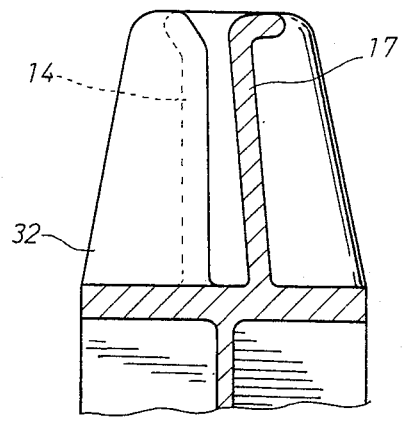
FIG. 10 is an enlarged partial cross sectional view of the securing unit according to the present invention, cut along the line X—X in FIG. 2.
Figure 11:
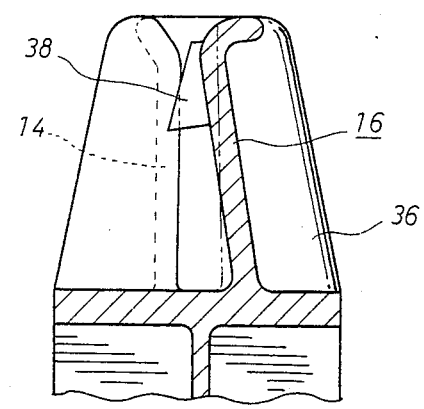
FIG. 11 is an enlarged cross sectional view of the securing unit according to the present invention, cut along the line XI—XI in FIG. 2.

At one surface of the bottom plate 12, there are provided vertically the pair of opposed walls 14,14 each of which has a surface that contacts a base plate 42 (see FIG. 12) to be gripped. The opposed walls 14 are spaced at a predetermined distance. Opposite the opposed walls 14,14 there is also provide the pair of holding members 17, 17 and the pushing member 16, each of which also has a contacting surface so as to sandwich grip the base board 42 or wiring plate between the opposed walls 14 on one side and the holding members 17 and the pushing member 16 on the other side. The opposed walls 14,14 are arranged in such a manner that their contacting surfaces are located in the same plane, i.e., in alignment. Moreover, the opposed walls 14 are, as shown in FIGS. 6,10 and 11, formed in such a manner that each wall 14 has a certain thickness with the upper edge of the member simply bent outwardly so as to permit the base plate to be easily inserted.

In addition, the opposed walls 14, 14 are provided with the ribs 32, 32 and 34,34 at the both ends thereof respectively, so as to reinforce the strength of the opposed walls 14,14. The outer ribs 34,34 extend also downward beyond the bottom plate 12 until they reach the same height or level as that of the seat plate 24 in this case. The inner surface or wall of each rib 34 serves to prevent the movement of the base plate 42 to be inserted and gripped in the lateral direction as a stop, respectively, and permits the positioning of the base plate 42.

The pushing member 16 and the holding members 17, 17 are located substantially in the middle of or between the opposed walls 14, 14 and are arranged spaced apart at a predetermined distance against the contacting surface of the opposed walls 14, 14. The holding members 17, 17 and the opposed walls 14, 14 are formed in such a manner that the distance or gap G (shown in FIG. 6) formed between the holding members 17, 17 and the opposed walls 14, 14 becomes slightly narrower toward upward in the plane including the contacting surface of the opposed walls 14, 14 as indicated in FIG. 10. Accordingly, the holding of the base plate 42 is secured.

Moreover, the pushing member 16 is more inclined than are the holding members 17,17 relative to the plane including the contacting surface of the opposed walls 14,14. The surface of the pushing member 16 is provided with a pair of detent projections, 38,38 that are capable of engaging with the mounting holes H (See FIG. 12) of the base plate 42. Additionally, the holding members 17,17 have a sufficient resiliency for holding the base plate 42. This is also true of the opposed walls 14,14 which also have a sufficient resiliency so as to securely hold the base plate 42. In this case, it is possible to provide a plurality of holding members 17—for example, four or more of them.

Figure 12:
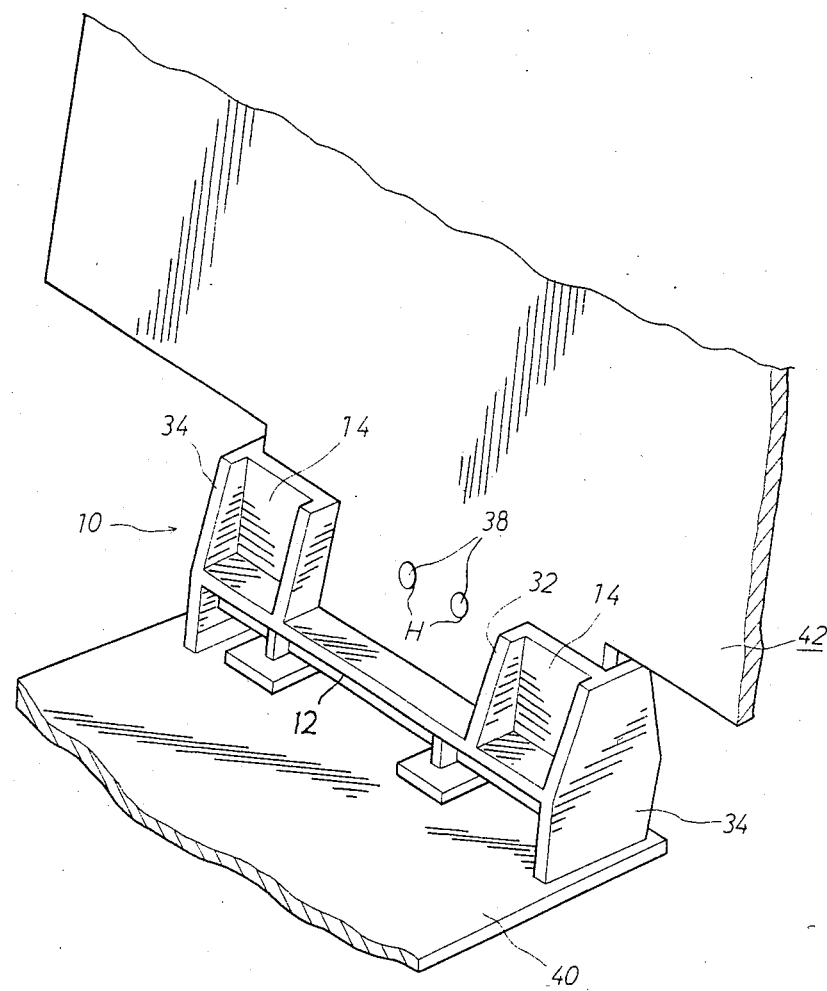
FIG. 12 is a perspective view of the securing unit according to the present invention which is mounting the base plate or board having two mounting holes formed thereon on one hand and the fixing plate member such as a chassis on the other hand.

FIG. 12 shows the securing unit 10 according to the present invention thus constructed in which the detent members 18, 18, not shown, have been mounted to a chassis 40 as a fixed plate member on one side, and the base plate 42 is mounted on the securing unit 10 in the other side. In this case, the detent projections 38,38 of the securing unit 10 according to the present invention are inserted into the holes H,H formed in the base plate 42 so as to secure the base plate. Since the detent projections 38, 38 are provided inclined as shown in FIG. 11, it is easy to insert the detent projections 38, 38 into the holes H, H of the base plate 42. Yet, when removing, it is also easy to remove the base plate 42 by strongly pulling the base plate 42 upwardly.

The movement of the base plate 42 in the upward and downward directions as well as in the lateral directions is restricted by the detent projections 38, 38. Additionally the lateral movement of the side edges of the base plate 42 is also restricted by the ribs 34,34 of the opposed walls 14, 14 so that no backlash is produced and the positioning of the base plate is secured. The ribs 34 serve as stops that prevent the movement of the base plate 42. However, each rib 34 may be a projection which contacts with the adjacent side edge of the base plate 42 or may be a notch which has been partly cut with respect to the rib 34.

Figure 13:
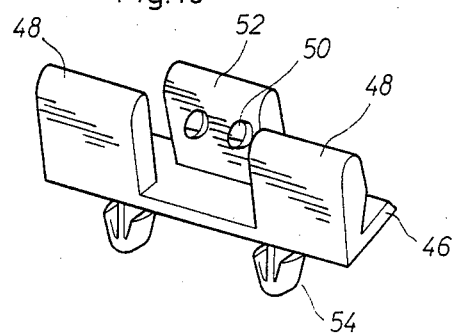
FIG. 13 is a perspective view of another embodiment of the securing unit according to the present invention.
Figure 14:
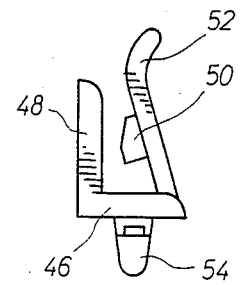
FIG. 14 is a side view of the securing unit according to the present invention shown in FIG. 13.

FIGS. 13 and 14 shown respectively perspective and side views of the securing unit according to the another embodiment of the invention. As shown in these figures, at the one side of the surface of a bottom plate 46, there are vertically provided a pair of opposed walls 48,48. At the other side of the surface of the bottom plate 46 there is provided a pushing member 52 having a pair of detent projections 50,50 which are capable of engaging with mounting holes formed on a base plate (not shown). The bottom plate 46 is provided with a pair of detent members 54, 54 at the bottom thereof, which are capable of mounting on a chassis (not shown).

Figure 15:
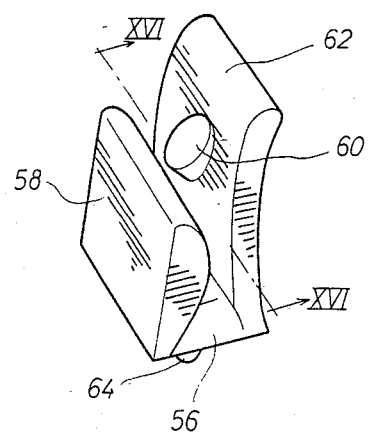
FIG. 15 is a third embodiment of the securing unit according to the present invention.
Figure 16:
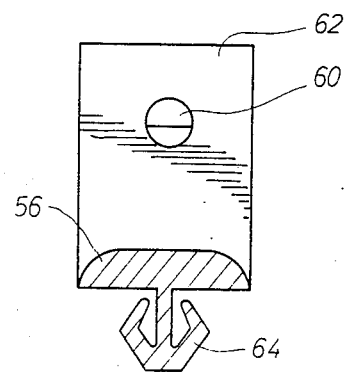
FIG. 16 is a cross sectional view of the securing unit according to the present invention, cut along the line XVI—XVI in FIG. 15.
Figure 17:
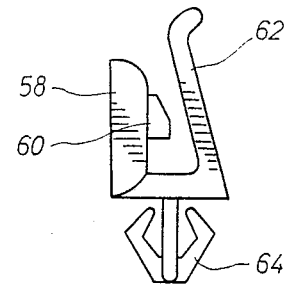
FIG. 17 shows a fourth embodiment of the securing unit according to the present invention in which the location of the detent projection is changed.

FIG. 15 shows a perspective view of a still another embodiment of the securing unit according to the present invention which comprises a bottom plate 56, an opposed wall 58 formed on the surface thereof, and a pushing member 62 having one detent projection 60. The opposed wall 58 and the pushing member 62 are formed so as to face each other. The securing unit according to this embodiment of the present invention has a detent member 64 at the rear side of the bottom plate 56 as shown in FIG. 16, which shows a plane view with a partial cross section of FIG. 15 in this embodiment. FIG. 17 shows a side view of the securing unit of the yet still another embodiment of the invention.

When mounting the base plate by use of the third and fourth embodiments of the securing unit, more than two securing units according to the invention are customarily used. In these embodiments, the detent projection 60 may be formed on the opposed wall 58 instead on the pushing member 62, as shown in FIG. 17. In any of the embodiments according to the present invention described in the foregoing, the detent member as a fixing or securing mechanism may be replaced with another conventionally used securing mechanism. Moreover, it is also possible for the detent projection or projections for preventing the movement of the base plate to be provided on the opposed wall, the holding member, the opposed wall and the holding members or the bottom plate.

As described in the foregoing, the securing unit of the invention which is arranged to push and grip the base plate can removably hold the base plate with a resiliency between the opposed wall(s) and the holding member(s) formed on the bottom plate of the securing unit.

It is also possible for the securing unit according to the invention to hold the base plate in the vertical direction on one side, and to insert the detent member or members into a hole or holes on a fixing plate member on the other side. Furthermore, since the base plate is resiliently gripped between the opposed wall(s) and the holding member(s), and since the detent projection or projections for preventing the shift or movement of the base plate is provided at any of the opposed wall, or the holding member, or the opposed wall and holding member or the bottom plate of the securing unit, the base plate can be suitably positioned and held without backlash.

While the invention has been described in its preferred embodiment, it is to be understood that the words which have been used are words of description rather than limitation and that various changes and modifications may be made within the purview of the appended claims without departing from the true scope and spirit of the invention in its broader aspects.

What is claimed is:

1. A securing unit for mounting a base plate containing at least one mounting hole at least substantially perpendicularly to a chassis, said securing unit comprising:

(a) a bottom plate which, in use, is at least substantially parallel to the chassis, said bottom plate having a first surface and a second surface, said second surface being at least substantially parallel to said first surface;

(b) at least one detent member extending from the first surface of said bottom plate, said at least one detent member being sized, shaped, and positioned to engage the securing unit to the chassis;

(c) a pair of spaced first walls extending at least approximately vertically from the second surface of said bottom plate, each of said pair of spaced first walls having a first side surface, a second side surface, a back surface, and a base plate-engaging surface for supporting a first side surface of a base plate during use of the securing unit, the base plate-engaging surface of each of said pair of spaced first walls extending from the second surface of said bottom plate to the top of said first wall, the base plate-engaging surfaces of said first walls being co-planar and the first side surface of one of said pair of spaced first walls facing the first side surface of the other one of said pair of spaced first walls and being separated therefrom by a gap extending from said second surface of said bottom plate to the top of each of said pair of spaced first walls and from the back surface to the base plate-engaging surface of each of said pair of spaced first walls;

(d) a pair of spaced second walls extending at least approximately vertically from the second surface of said bottom plate, each of said pair of spaced second walls having a first side surface, a second side surface, a back surface, and a base plate-engaging surface for supporting a second side surface of a base plate during use of the securing unit, the base plate-engaging surface of each of said pair of spaced second walls extending from the second surface of said bottom plate to the top of said second wall, the base plate-engaging surfaces of said second walls being co-planar and the first side surface of one of said pair of spaced second walls facing the first side surface of the other one of said pair of spaced second walls and being separated therefrom by a gap extending from said second surface of said bottom plate to the top of each of said pair of spaced second walls and from the back surface to the base plate-engaging surface of each of said pair of spaced second walls, the base plate-engaging surfaces of said second walls being at least substantially parallel to and facing the base plate-engaging surfaces of said first walls and being spaced therefrom by a distance which permits the base plate to be received therebetween during use of the securing unit;

(e) a resilient pushing member extending approximately vertically from the second surface of said bottom plate between said pair of spaced second walls, said pushing member having a base plate-engaging surface which is approximately co-planar with the base plate-engaging surfaces of said second walls and which extends from said second surface of said bottom plate to the top of said resilient pushing member, said pushing member being sized, shaped, and positioned so that its base plate-engaging surface bears resiliently against a base plate received between said pair of spaced first walls and said pair of spaced second walls and pushes the base plate toward and into engagement with the base plate-engaging surfaces on said pair of spaced first walls; and (f) at least one detent projection projecting from the base plate-engaging surface of said resilient pushing member, said at least one detent projection being sized, shaped, and positioned to be releasably received in a corresponding mounting hole in the base plate during use of the securing unit.

2. A securing unit as recited in claim 1 wherein:
(a) said at least one detent projection has an inner surface facing the base plate-engaging surfaces of said pair of spaced first walls and
(b) said inner surface slants toward said base plate-engaging surfaces of said pair of spaced first walls from the edge of said inner surface remote from said bottom plate toward the edge of said inner surface adjacent to said bottom plate.

3. A securing unit as recited in claim 1 wherein the edge of the base plate-engaging surfaces of said pair of spaced first walls and the edge of the base plate-engaging surfaces of said pair of spaced second walls remote from said bottom plate are flared away from each other to facilitate entry of a base plate therebetween.

4. A securing unit as recited in claim 1 and further comprising:
(a) a first rib extending at least approximately perpendicularly from the first surface of said bottom plate and
(b) a second rib extending at least approximately perpendicularly from the first surface of said bottom plate, said second rib crossing said first rib at at least approximately a right angle thereto, said at least one detent member being mounted on said rib.

5. A securing unit as recited in claim 1 and further comprising a third rib extending between the second surface of said bottom plate and the back surface of each of said pair of spaced first walls to brace said first walls.

6. A securing unit as recited in claim 1 and further comprising a fourth rib extending between the second surface of said bottom plate and the back surface of each of said pair of spaced second walls to brace said second walls.

7. A securing unit as recited in claim 1 and further comprising a fifth rib extending between the second surface of said bottom plate and each of said pair of spaced first walls on the same side as the base plate-engaging surfaces of said pair of spaced first walls, said fifth ribs serving to brace said pair of spaced first walls and to prevent lateral movement of the base plate during use of the securing unit.

8. A securing unit as recited in claim 1 wherein the distance between the plane of the base plate-engaging surfaces of said pair of spaced first walls and the plane of the base plate-engaging surfaces of said pair of spaced second walls gradually decreases in the direction away from said bottom plate.

* * * * *